United States Patent
Kaiser

(10) Patent No.: US 7,251,796 B2
(45) Date of Patent: Jul. 31, 2007

(54) PREDICTIVE EVENT SCHEDULING IN AN ITERATIVE TRAN RESOLUTION NETWORK

(75) Inventor: Dan R. Kaiser, Windham, NH (US)

(73) Assignee: Cadence Design Systems, Inc., San Jose, CA (US)

( * ) Notice: Subject to any disclaimer, the term of this patent is extended or adjusted under 35 U.S.C. 154(b) by 242 days.

(21) Appl. No.: 10/957,106

(22) Filed: Oct. 1, 2004

(65) Prior Publication Data

US 2006/0074620 A1 Apr. 6, 2006

(51) Int. Cl.
G06F 17/50 (2006.01)

(52) U.S. Cl. .............................. 716/4; 716/5

(58) Field of Classification Search ................ 716/4–5; 703/16–17
See application file for complete search history.

(56) References Cited

U.S. PATENT DOCUMENTS 6,850,999 B1 * 2/2005 Mak et al. ................. 710/39

2002/0163889 A1 * 11/2002 Yemini et al. ............. 370/238

OTHER PUBLICATIONS

Kaiser, D.R., et al., "Performance Optimizations in NC-Verilog", Proceedings Cadence Technical Conference 1997, May 1997.
Cadence® NC-Verilog® Simulator Help, Product Version 5.1, User's Manual, Sep. 2003 (1000+ pages).

* cited by examiner

Primary Examiner—Vuthe Siek
(74) Attorney, Agent, or Firm—Bingham McCutchen LLP

(57) ABSTRACT

A method and system for resolving circuit and network parameters. A circuit evaluation system includes a plurality of nodes and a plurality of resolution devices. Each node is connected to a resolution device via a bi-directional connection, and at least one node is configured to receive data from an input. Each enabling element is associated with a resolution device. Enabling elements that are associated with resolution devices that are connected to nodes that are configured to receive input data are activated, thereby enabling certain resolution devices. The enabled resolution devices are executed using data in the nodes that are connected to the enabled resolution devices. Iterations of executing resolution devices are performed until stable node values are determined.

60 Claims, 15 Drawing Sheets

PREDICTIVE EVENT SCHEDULING IN AN ITERATIVE TRAN RESOLUTION NETWORK

FIELD OF THE INVENTION

The present invention is generally directed to modeling circuits or networks, and more particularly, to a method and a system for resolving values of a circuit or a network in a more space and time efficient manner by selectively enabling resolution devices within an iterative resolution algorithm.

BACKGROUND

Various methods and systems have been used to resolve or solve for device or component values in a network or circuit (generally "network") of bi-directional devices in order to determine which values satisfy or solve the network. Typically, resolution devices are coupled to nodes via bi-directional data connections. One known system includes resolution devices that are executed in an iterative algorithm. In other words, the iterative algorithm repeatedly applies a bi-directional resolution function to the values of corresponding network nodes until the node values do not change and settle into a stable set of values, which is a solution to the network.

One conventional system is a TRAN network in a Verilog simulation. The TRAN network is a model of a circuit containing bi-directional "TRAN" elements that is expressed as a set of Verilog "TRAN" elements and "WIRE" connections. The TRAN network takes input values and processes them to produce outputs, which may be the same as or different from the node values depending on the stability of the network based on the inputs. Outputs that represent new node values replace the old node values, and the TRAN resolution functions can be applied using these "new" node values.

More particularly, a TRAN network includes internal nodes with values, resolution or TRAN devices, and bi-directional connections between one or more nodes and the TRAN resolution devices. The input values to TRAN devices can be any Verilog signal. Verilog is a well known language that is used to describe hardware components and their relationships. The resolution devices take the Verilog signals and process them using a set of resolution functions in order to resolve the network and determine stable node values.

More specifically, during initialization, all of the internal TRAN nodes are initialized to an undriven state. The value of a driver is copied into the internal node of the TRAN network that is connected to the driver. Thus, there may be some nodes that are maintained in the undriven state since they do not receive an input from a driver, and other nodes that are updated from the initial undriven state with a driver input value. The internal nodes are connected to one or more resolution devices, which execute a TRAN resolution function using the node values. More particularly, the resolution function of each resolution device is repeatedly applied to its inputs in a loop, as provided in the following pseudo-code of a conventional iterative TRAN resolution algorithm:

```
Tran_network_resolution (TRANs, INPUTs)
{
    foreach INPUT {
        if (driven (INPUT)) {
            INPUT = driving value;
        }
```

-continued

```
        else {
            INPUT = undriven value (1'bz);
        }
    }
    change = TRUE;
    while (change) {
        change = FALSE;
        foreach TRAN {
            new_value = tran_resolution (TRAN);
            change = change | new_value
        }
    }
    for each INPUT {
        schedule new value;
    }
}
```

Thus, all of the TRAN resolution devices are evaluated once during each iteration. The iterations continue to generate outputs or "new" node values, which are processed until the node values become stable. Stable node values are then copied out of the internal nodes by a reader or other external device.

The conventional implementation of TRAN networks, however, can be improved. For example, regardless of whether some nodes have updated or undriven driver values, all of the resolution devices are evaluated as a result of the iterative loops of such networks. Thus, while the iterative TRAN resolution approach may be space efficient and provide a relatively compact solution, all of the resolution functions are repeatedly executed and repeatedly executed on node values that may not relevant to the analysis. Thus, an iterative TRAN analysis can take a long time to complete and is inherently inefficient. Thus, the costs and time required to model circuits and networks is unnecessarily increased. These shortcomings are amplified with more complicated systems and as more TRAN resolution devices are utilized.

An alternative prior art approach that has been used is to convert the TRAN network into an equivalent set of basic unidirectional devices, which are then evaluated using a traditional event simulator. This alternative approach may provide a more computationally efficient method compared to an iterative algorithm approach, however, it generates a substantially larger representation of the network and devices, resulting in a large event simulation that is not space efficient.

Accordingly, there exists a need for a system and method that can process and resolve networks in a more time and space efficient manner.

SUMMARY

In accordance with one embodiment is a method of analyzing a circuit, Initially, an evaluation system is provided. The evaluation system includes nodes and resolution devices. Each node is associated with a resolution device, and at least one node being configured to store data. An enabling element is associated with each resolution device, and an enabling element is activated if an output of the associated resolution device will change based on data of an associated node changing. One or more resolution devices that are associated with activated enabling elements are enabled, and the enabled resolution devices use the changed node data.

In another embodiment is a method of analyzing a circuit in which an evaluation is initially provided. The evaluation system includes a plurality of nodes and a plurality of resolution devices. Each node is associated with a resolution device, and at least one node stores data. An enabling bit is associated with each resolution device and activated if it is associated with a resolution device having an output that will change based on data of an associated node changing. One or more resolution devices are enabled if they are associated with an activated enabling elements. The enabled resolution devices are executed using the changed node data that is received from nodes that are associated with the enabled resolution devices. Enabling bits that are associated with resolution devices that have been executed are then de-activated.

In a further embodiment, a system for analyzing a circuit includes a circuit evaluation system and enabling elements. The evaluation system includes a plurality of nodes and a plurality of iterative resolution devices. Each node is associated with an iterative resolution device, and at least one node receives data from an input, such as a driver. Each iterative resolution device is associated with an enabling element, and an enabling bit is activated if it is associated with an iterative resolution device having an output that will change based on data of an associated node changing. Selected resolution devices are enabled in response to the activated enabling bits and are executed using data in nodes that are associated with the enabled resolution devices.

In various embodiments, the resolution devices may be iterative, bi-directional resolution devices that allow data to be sent between a resolution device and a node. Further, an evaluation system can include a reference list or a list of enabling flags, which identifies resolution devices and nodes that are associated with each other.

A resolution device can be associated with a plurality of nodes. A node can receive the same data from different drivers or initially store undriven data. Further, other fanout nodes can be associated with a node that is being evaluated. Enabling elements that are associated with resolution devices that were executed with the changed node data are de-activated.

The output generated by an executed resolution device can be the same as or different than data that is currently stored in an associated node. When the node values stabilize, the nodes are stable, resulting in a solution for the circuit. The static node values can be the same as or different than the initial node data.

DETAILED DESCRIPTION OF ILLUSTRATED EMBODIMENTS

In the following description, reference is made to the accompanying drawings which form a part hereof, and which show by way of illustration various method and system embodiments that may be practiced.

One embodiment of a method of resolving network values involves incorporating predictive event scheduling ("PES") into an iterative resolution network, such as an iterative TRAN network. In PES, devices are marked as either active or inactive. A resolution device is marked active when a change on its inputs would affect the output of the device. During evaluation of the network, active devices are evaluated, and inactive devices are skipped and not evaluated. Combining PES and iterative resolution provides a selective evaluation process that is completed more efficiently since computation time and other resources are not consumed by analyzing resolution devices that are not involved in the analysis.

Figure 1A:
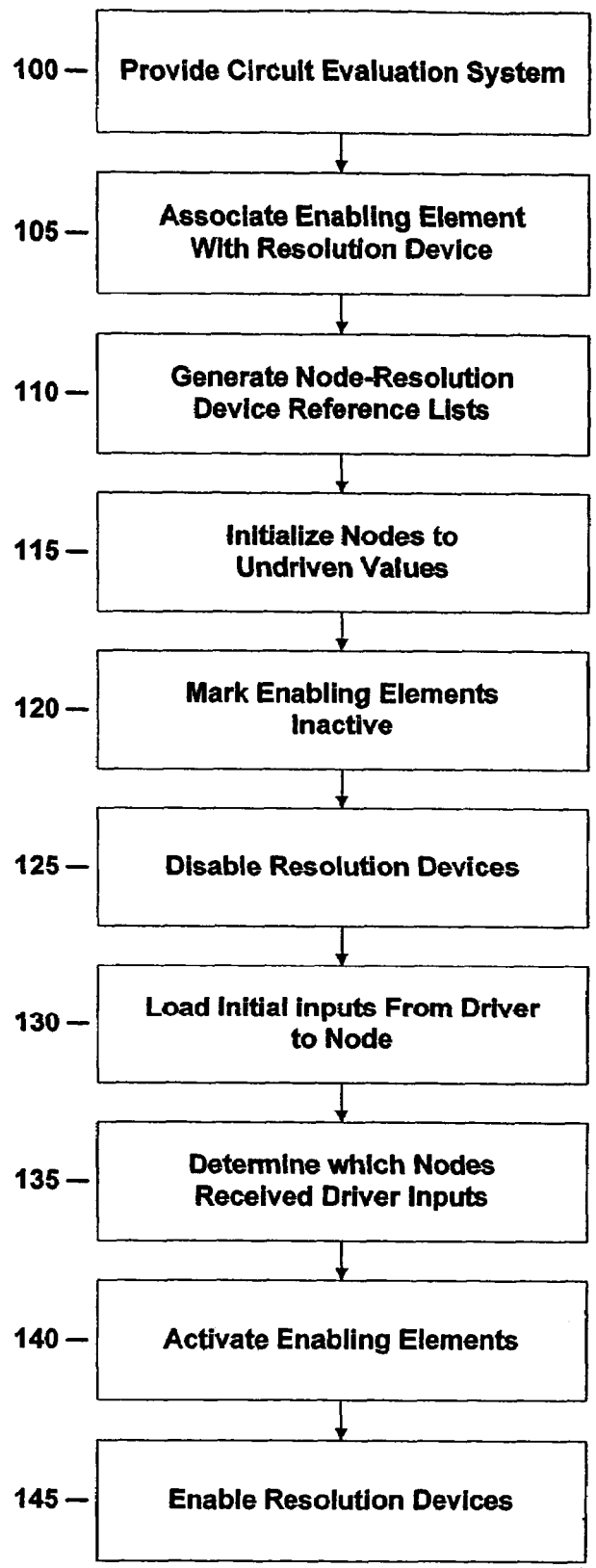
FIG. 1A–B are flow diagrams generally illustrating one embodiment of a method for resolving an iterative network that incorporates Predictive Event Scheduling (PES)
Figure 1B:
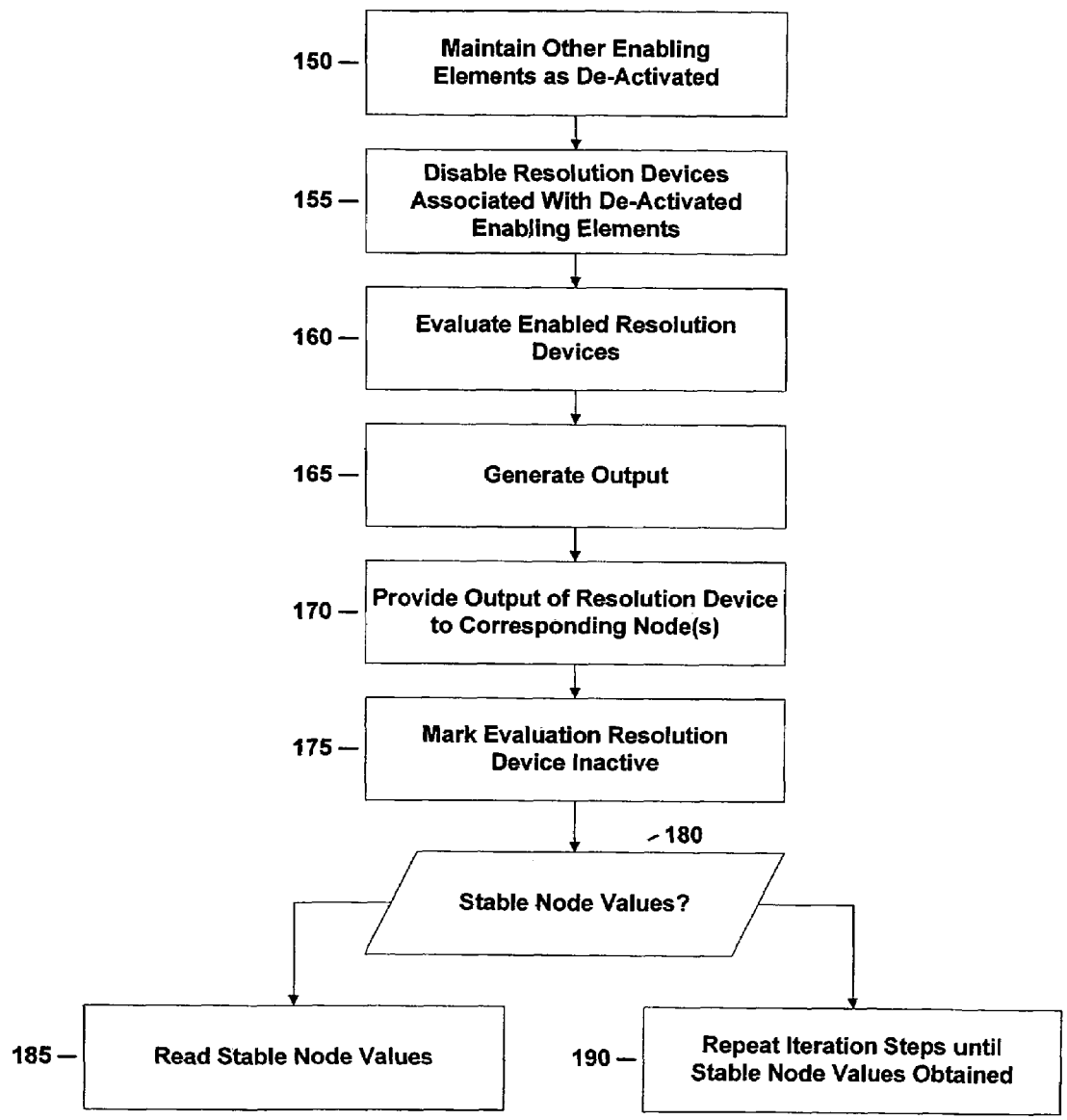

FIG. 1 illustrates one embodiment of a method for resolving network data or values. In step 100, a circuit evaluation system is provided. A circuit evaluation system includes drivers and an interactive resolution system. An interactive resolution system includes internal nodes and iterative resolution devices, such as TRAN devices. The circuit evaluation system also includes an enabling system. The enabling system includes an enabling element, such as an enabling bit.

In step 105, an enabling element is associated with a resolution device. An enabling element can be active or inactive. The enabling system also includes reference lists. In step 110, reference lists are generated for each node. Each reference list identifies the resolution devices that refer or are connected to each node. Thus, an association is made between the node currently being examined and resolution devices attached thereto. For each node, the association is kept using a list of the enabling flags or bits of the resolution devices. Additionally, associations are made between a node currently being examined and other "fanout" nodes, i.e., nodes that are associated with the current node being evaluated and whose data or values may change after the current node is evaluated. In step 115, the data or values (generally "data") of internal nodes of the iterative network are initialized to an undriven state. In step 120, all of the enabling elements are initially marked inactive. As a result, in step 125, all of the resolution devices are initially disabled. A resolution device is either enabled or disabled depending on whether the enabling elements are active or inactive, respectively. Of course, different logic relationships can be used so that an enabling element that is not active can enable a resolution device. For purposes of explanation, however, activated enabling elements are associated with enabled resolution devices.

In step 130, initial inputs are loaded from a driver into one or more nodes, thereby replacing the undriven value or data with input data from a driver. In step 135, the nodes are analyzed to determine which nodes have received inputs and which nodes are maintained in an undriven state.

In step 140, the states of enabling elements are changed from inactive to active if the enabling element is associated with a resolution device that is connected to a node that receives a driver input. As a result, in step 145, resolution devices are enabled if they are associated with activated enabling elements. More specifically, for each node, there is a set of resolution devices which are enabled when the node value changes. The resolution devices included within the set are identified using a list of the enabling flags or bits for the resolution devices. In step 150, the enabling elements of other resolution devices remain inactive. Thus, in step 155, resolution devices are disabled or continue to be disabled if they are associated with inactive enabling elements. A state of an enabling element is changed if the corresponding node data or values are not stable and must be further processed by a resolution device.

In step 160, the enabled resolution devices are evaluated, and a resolution function is executed using the node data or values. More specifically, the flags in the association list are enabled so that the corresponding resolution devices are executed on the next iteration following the change of data or value stored in the node. Resolution devices that were disabled are skipped and not evaluated. In step 165, the evaluation of the resolution devices produces an output, which is then provided to corresponding nodes in step 170.

In step 175, as a resolution device is evaluated, it is marked locally inactive so that only the node being currently evaluated is deactivated. Alternatively, the resolution device may be marked inactive after it has been evaluated.

A determination is made in step 180 whether the output of the resolution devices are stable node values. If the node values are stable, then in step 185, the values are retrieved or sent to an external device, such as a reader. Otherwise, in step 190, the output is not stable, and the iteration steps 160–180 are repeated until stable nodes values are obtained and the network is resolved.

Using method embodiments, a resolution device that was previously enabled and evaluated may be enabled again or disabled based on the outputs generated by the resolution devices. Moreover, a resolution device that was previously disabled and skipped may be enabled and evaluated during subsequent iterations depending on the outputs generated by resolution devices that were evaluated earlier. Thus, evaluation iterations can involve different numbers and sequences of resolution devices until the network is resolved (assuming a solution exists). Accordingly, embodiments are not limited to evaluating only certain resolution devices, resolution devices in particular sequences or resolution devices that were marked in a certain way in previous iterations.

Method embodiments provide time and space efficient manners of resolving circuit networks by evaluating only the resolution devices whose outputs may change based on driver or node inputs. Other resolution devices, however, are skipped. Thus, embodiments that use an iterative resolution network, such as a TRAN network, that is configured with PES capabilities provide time and space efficient methods of resolving a network. Since only the resolution devices of interest are evaluated.

Persons of ordinary skill in the art will appreciate that it is not necessary to perform the previously described steps in the exact order described. Some variation may be incorporated into embodiments depending on the particular application. Further, selected steps may be executed concurrently. Accordingly, FIG. 1 provides a general, non-limiting description of method embodiments and their operation. FIGS. 2–7 illustrate a general system implementation of a combined iterative and PES system, and FIGS. 8–15 illustrate in further detail how an enabling system is utilized to incorporate PES capabilities into an iterative resolution network.

Figure 2:
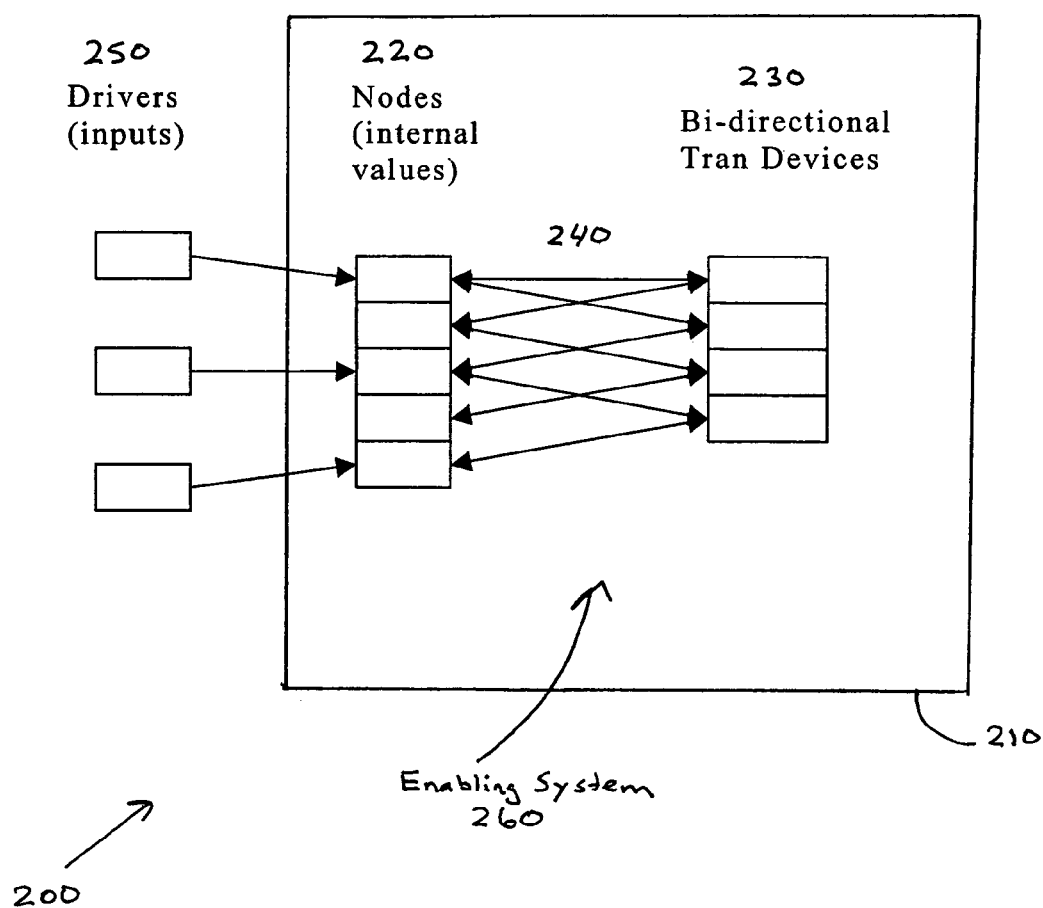
FIG. 2 is a general system diagram of an iterative resolution network containing bi-directional devices.

Referring to FIG. 2, according to one embodiment, a circuit evaluation system 200 for analyzing and resolving node values of a network includes an iterative resolution network 210, which includes a plurality of internal nodes 220, a plurality of iterative resolution devices 230, and bi-directional connections 240 between nodes 220 and resolution devices 240. The system 200 also includes drivers 250, which provide initial data 252 or values to internal nodes 220. The system also includes an enabling system 260, which incorporates PES capabilities into the iterative resolution network 210. According to one embodiment, the resolution network 210 is an iterative TRAN network with iterative TRAN resolution devices. The PES algorithm can be applied to any network which is 1. iterative and 2. it can predetermined from the evaluation of a particular device which other devices may need to be evaluated. While other iterative resolution systems can be utilized, this specification refers to an iterative TRAN resolution network for purposes of explanation not lemmatization.

Figure 3:
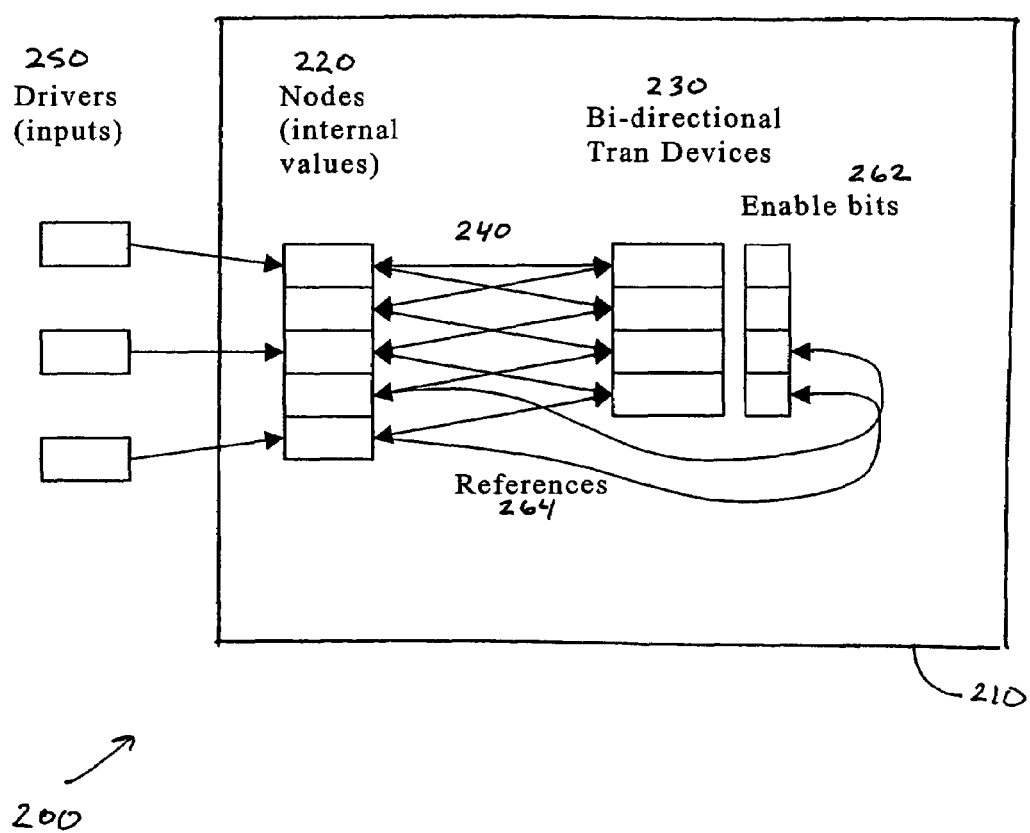
FIG. 3 illustrates driver, network, and enabling system connections of an iterative resolution network that is configured with an enabling system to provide PES capabilities according to one embodiment.

FIGS. 3–7 illustrate in further detail how PES capabilities are integrated into an iterative TRAN network. Referring to FIG. 3, the enabling system 260 includes an enabling element 262 and a reference list 264. Each resolution device 230 is associated with an enabling element 262. In one embodiment, the enabling element 262 is an enabling bit.

The enabling system 260 also includes reference lists 264. Each node 260 is associated with a reference list 264, which identifies the resolution devices 230 that are connected to each node 220. The connections 240 between the nodes 220 and the resolution devices 230 are bi-directional connections. Thus, values can be provided from a node 220 to a resolution device 230, and a resolution device 230 can provide an output or new data node that replaces the previous or original node data.

Thus, if there are five nodes 220, there would be five reference lists 264, and each reference list 264 identifies the resolution devices 230 that refers to each node 220. The enable bits 262 are also associated with the nodes 220 so that the value of the enable bits 262 can be changed based on the node 220 values. Accordingly, there are associations involving a subject node being evaluated and other nodes or "fanout" nodes whose values may change based on a change so that a change involving a particular node is provided to other nodes whose values may consequently change.

Figure 4:
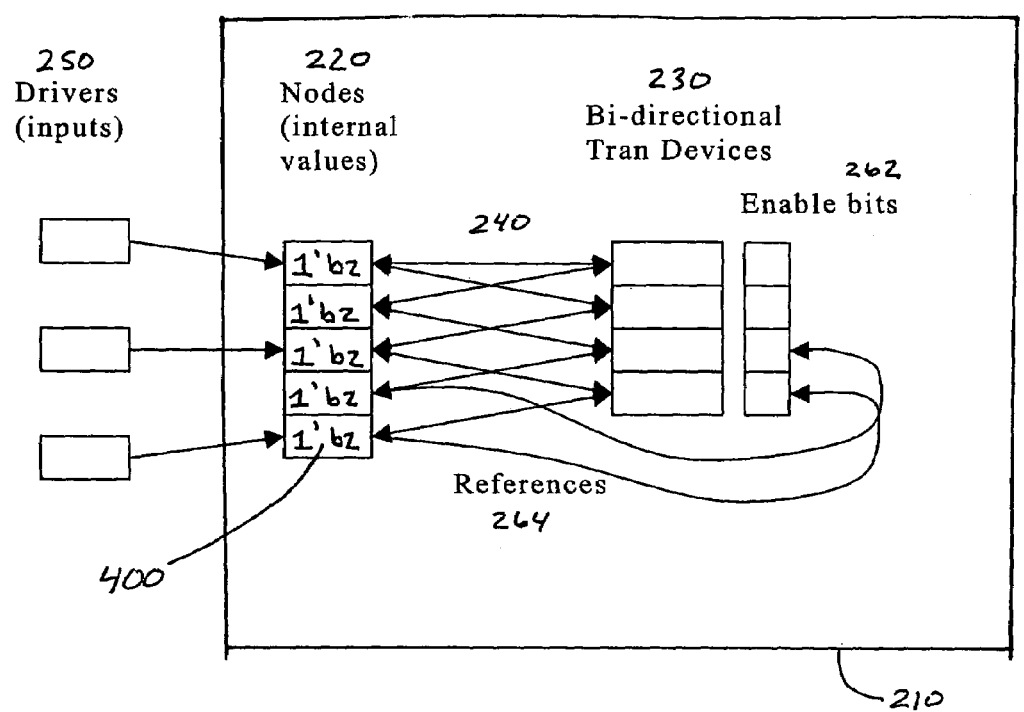
FIG. 4 illustrates node values that are initialized to an undriven state as the first step of the network evaluation.
Figure 5:
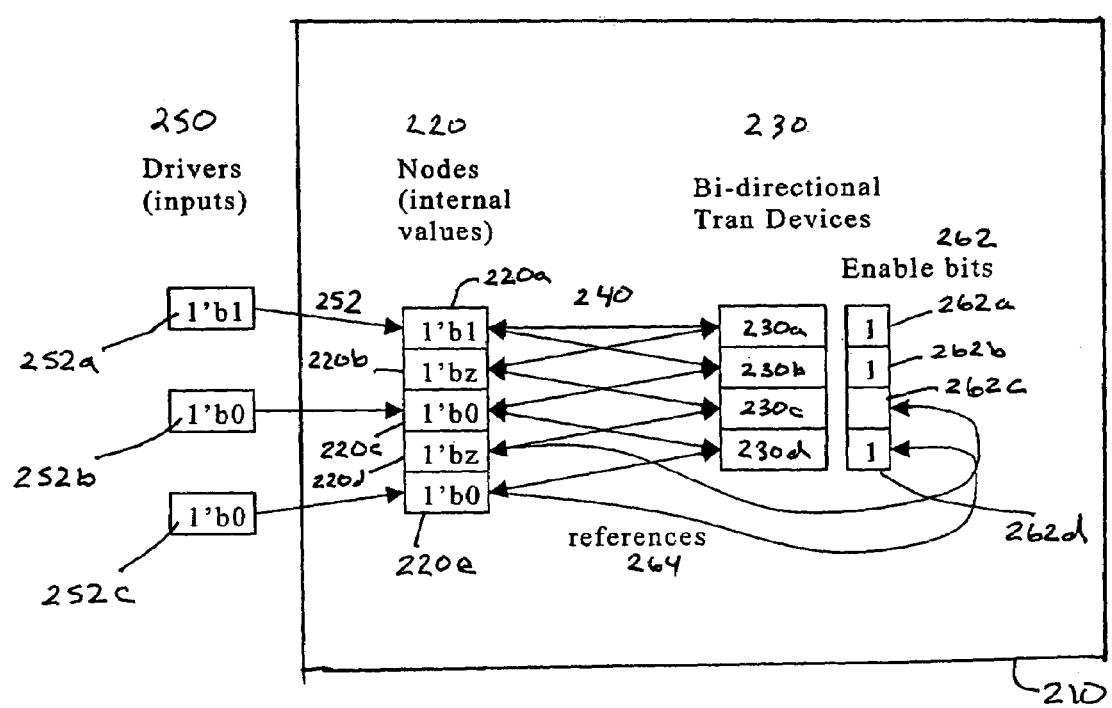
FIG. 5 illustrates driver inputs being loaded into nodes and activating corresponding enabling elements as the second step of the network evaluation.

Referring to FIG. 4, the values of all of internal nodes 220 are initialized to an undriven state 400, identified as $1'bz$. Referring to FIG. 5, one or more drivers 250 are connected to one or more nodes 220 and include input values 252. These input values 252 are provided to respective nodes 220 to replace the initial undriven values $1'bz$ 400 of certain nodes.

For example, as shown in FIG. 5, the value 1'b1 252a replaces the initial value 1'bz 400a of node 220a, 1'b0 252b replaces the initial value 1'bz 400c of node 220c, and 1'b0 252c replaces the initial value 1'bz 400c of node 220e. As a result, some nodes may have their values changed, whereas other node values may have the same 1'bz 400 value, such as nodes 220b and 220d. Of course, the numbers and selection of nodes that receive driver inputs can change with different system configurations. Thus, some or all of the nodes may receive driver inputs.

FIG. 5 illustrates an embodiment in which some of the nodes receive driver inputs, whereas other nodes are maintained with the initial undriven node values 1'bz 400. The enable bits 262a, 262b, 262d that are associated with resolution devices 230a, 230b, 230d that are connected to the nodes 220a, 220c, 220e that receive the updated driver values 252a–c are activated. As a result, the corresponding resolution devices 230a, 230b, 230d are enabled.

Figure 6:
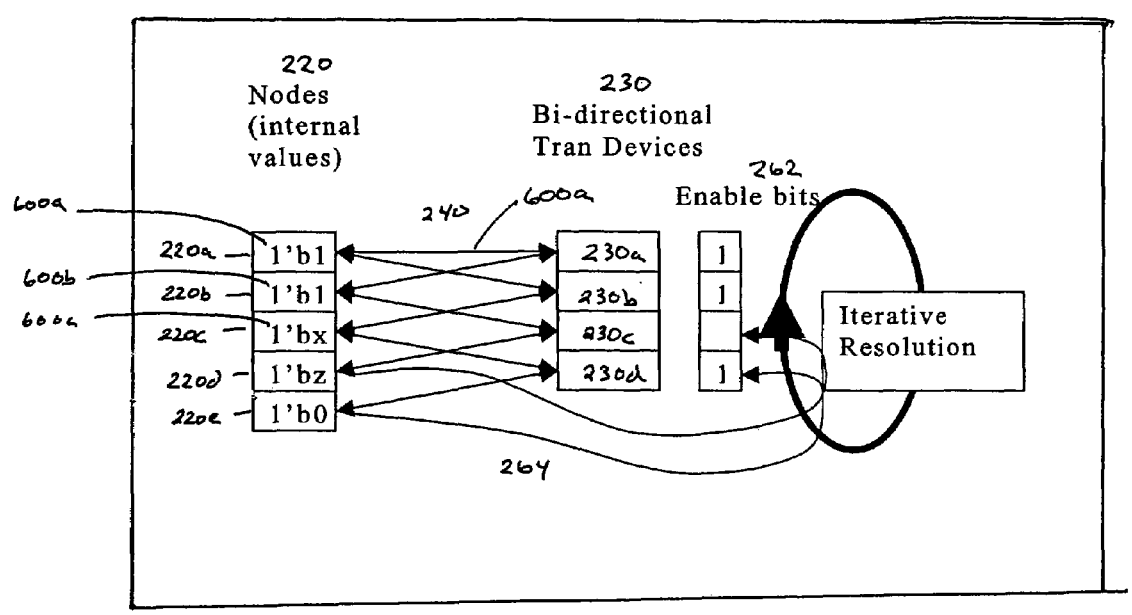
FIG. 6 illustrates iterations of evaluating resolution devices.

Referring to FIG. 6, the enabled resolution devices are executed or evaluated and generate outputs. The outputs may be the same or different as the values of nodes connected to the corresponding resolution devices. If the output values are different, then the values of corresponding nodes can change, and iterations can continue until stable node values are obtained.

In the illustrated embodiment, the output 600a of the resolution device 230a after a first iteration does not change the 1'b1 value of node 220a, whereas the output of the resolution device 230a changes the 1'bz value 400b (initially undriven value) of node 220b to 1'b1 600b. Further, the value of node 220c is changed from 1'b0 to 1'bx 600c, whereas the value of node 220d is maintained as an undriven value, 1'bz. The value of the node 230e is maintained as 1'b0, which was received from the driver 250c.

Thus, the output of a node may maintain an initially undriven value, maintain an initial value received from a driver, change a node from an initially undriven value to a new value, or change a node value from an initial driver value to a new value.

Figure 7:
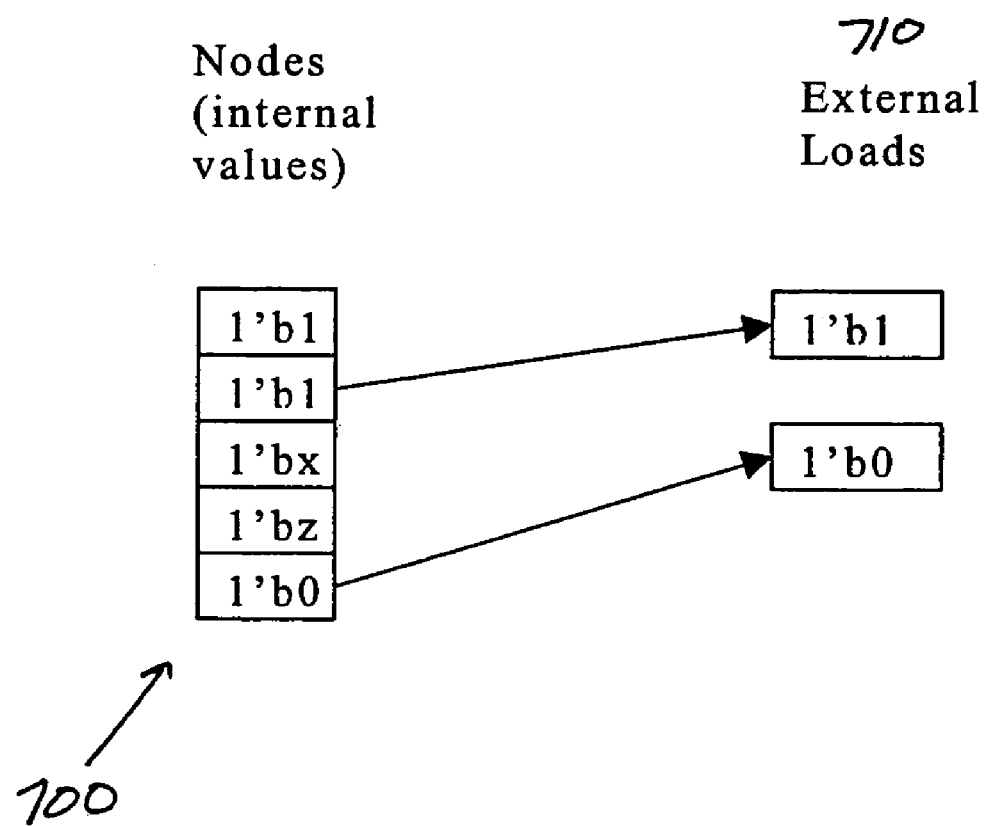
FIG. 7 illustrates reading out stable node values following one or more resolution iterations.

Iterations of evaluating inputs and generating outputs are performed until a stable set of nodes values is obtained. Referring to FIG. 7, the stable values 700 can then be read by a reader or other external device 710. The stable node values represent a solution to the circuit or network.

The incorporation of PES into an iterative resolution device, such as a TRAN device, as discussed above with reference to FIGS. 2–7 is provided in the pseudo-code below:

```
PES_tran_network_resolution (TRANs, INPUTs)
{
    foreach (TRAN) {
        mark_inactive (TRAN)
    }
    for each INPUT {
        if (driven (INPUT)) {
            INPUT = driving value;
            for each (TRAN = output_trans(INPUT)) {
                mark_active(TRAN);
            }
        }
    }
    change = TRUE;
    while (change) {
        change = FALSE;
        for each TRAN {
            if (is_active(TRAN)) {
                tran_resolution ( TRAN );
                foreach (OUTPUT = bidirection_output (
```

-continued

```
                TRAN )){
                    if (value_change(OUTPUT)){
                        change = TRUE;
                        for each (OTRAN = connected_tran
(OUTPUT))
                        {
                            mark_Active (OTRAN);
                        }
                    }
                }
            }
        }
    }
}
```

In particular, the pseudo-code section
foreach (TRAN) {
  mark_inactive (TRAN)
corresponds to Steps 115–125, in which all resolution devices are initialized and disabled.
The pseudo-code section
}
for each INPUT {
  if (driven (INPUT)) {
    INPUT = driving value;
    for each (TRAN = output_trans(INPUT)) {
      mark_active(TRAN);

corresponds to steps 135–145 in which the nodes are reviewed to determine whether they receive an input from a driver and if so, the enabling bits are marked active, thereby enabling one or more TRAN resolution devices.

The remaining pseudo code sections relate to the iterations of evaluating resolution devices in order to obtain a stable set of node values, which satisfy the network.

FIGS. 8–15 illustrate a more detailed implementation of method and system embodiments, further demonstrating the benefits of configuring iterative resolution devices with PES capabilities. In particular, FIGS. 8–15 illustrate in further detail how the enabling elements and reference lists are utilized.

Figure 8:
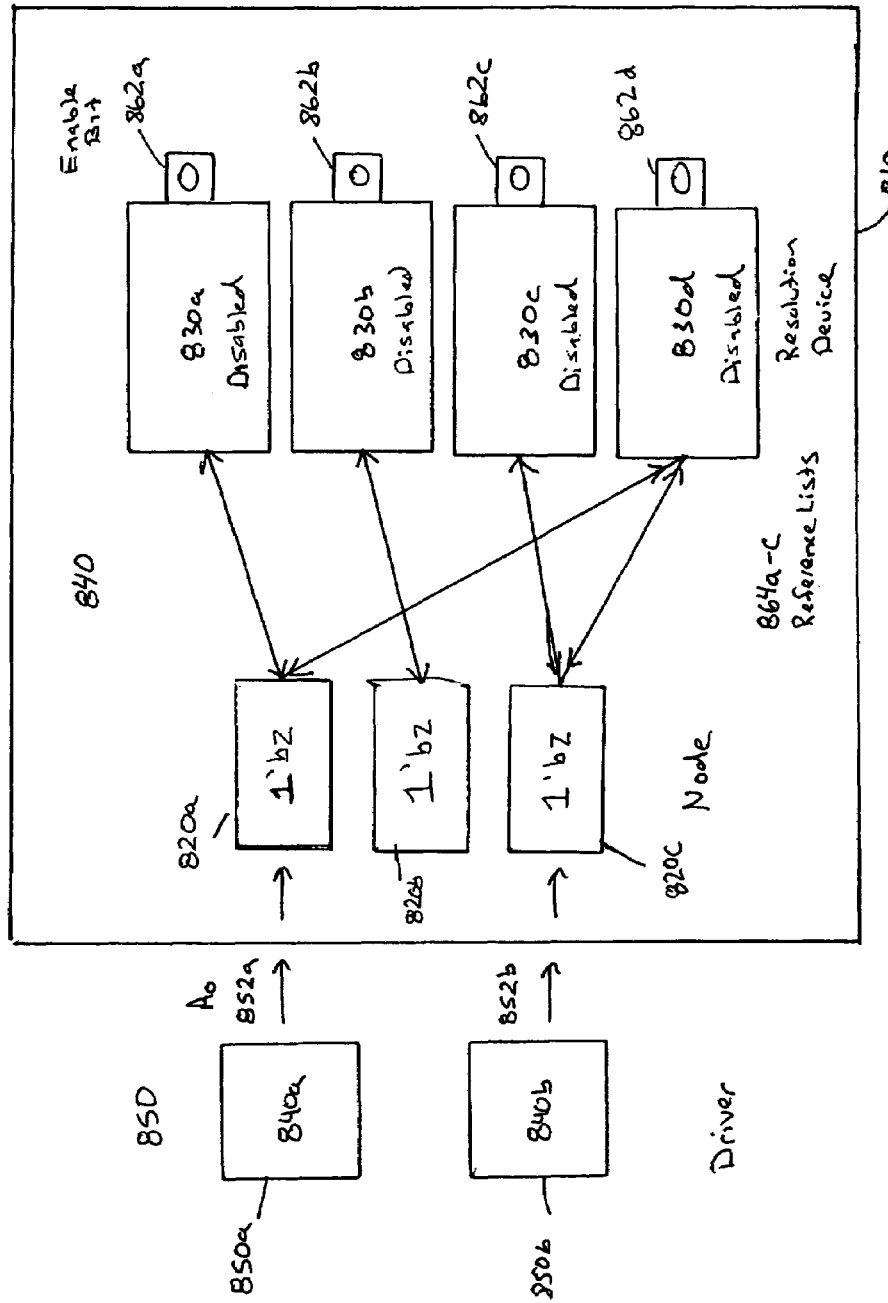
FIG. 8 illustrates in further detail the manner in which enabling elements are activated and de-activated to enable and disable resolution devices.

Referring to FIG. 8, a circuit evaluation system 800 for analyzing and resolving network values includes a TRAN resolution system 810 with three nodes 820a–c and four resolution devices 830a–d. All of the nodes are initialized with undriven values 1'bz, and all of the enabling bits 862 are de-activated so that the resolution devices are all initially disabled. Persons of ordinary skill in the art will appreciate that FIG. 8 represents a very simplified circuit or network configuration, and that the system and method can be utilized to resolve much larger and more complicated networks and circuits.

Figure 9:
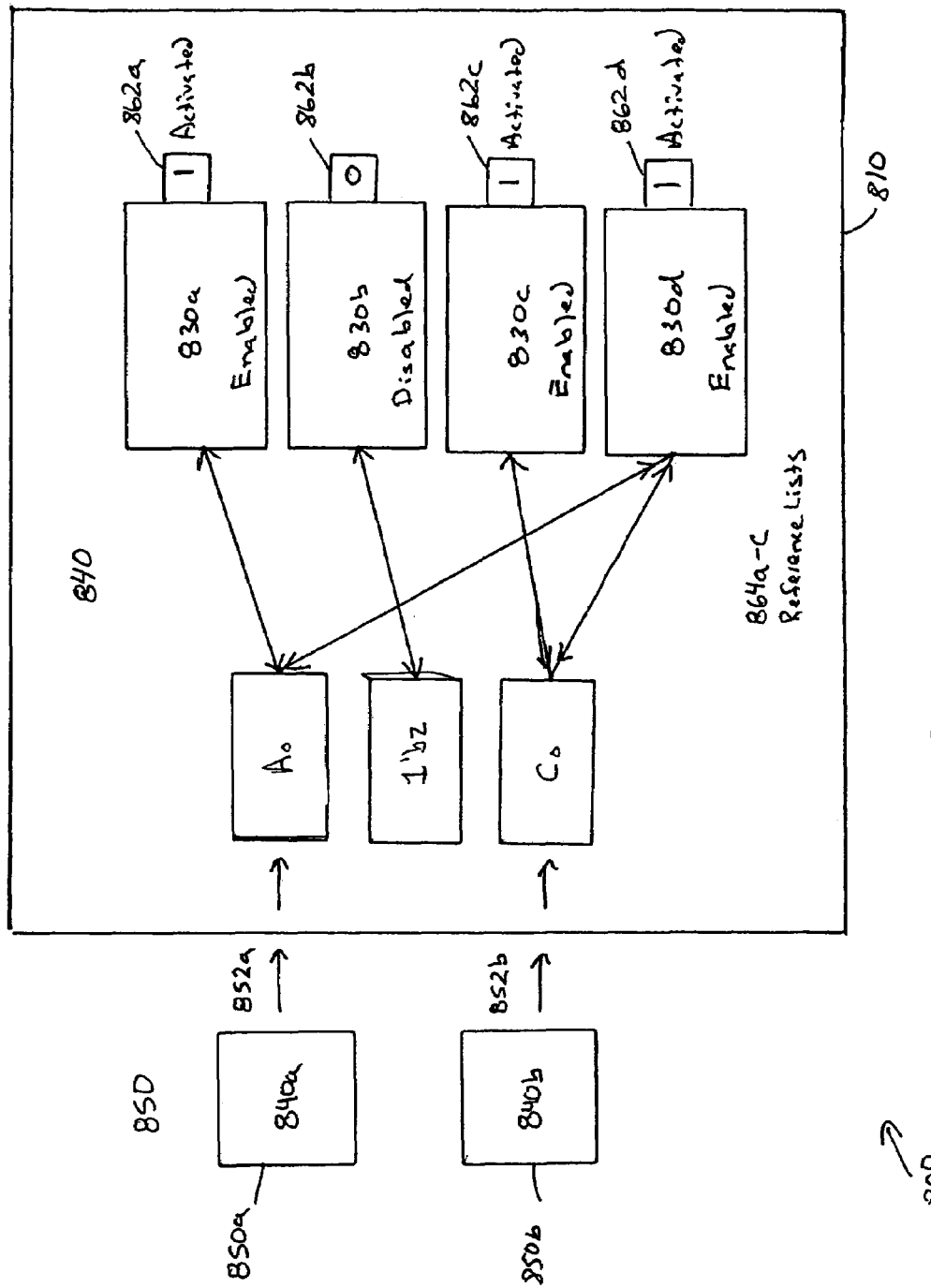
FIG. 9 illustrates in further detail the manner in which nodes receive input values and the corresponding settings of enabling elements.

Referring to FIG. 9, the two drivers 840a–b provide initial input data to Nodes A and C 820a, 820c. Specifically, input A0 852a is provided to Node A 820a, and input C0 852c is provide to Node C 820c. Thus, node B 820b does not receive an input from a driver and is maintained with the undriven value 1'bz.

Based on the bi-directional connections 840 between the nodes and the resolution devices, reference lists A, B and C 864a–c can be generated:

Reference List A: Node A—Resolution Device A
Node A—Resolution Device D
Reference List B: Node B—Resolution Device B
Reference List C: Node C—Resolution Device C
Node C—Resolution Device D Thus, a reference list 864 includes connections between one node and different numbers of resolution devices (e.g., zero, one or multiple resolution devices). Further reference lists can include connections to the same or different resolution devices, as shown in FIG. 9.

Node values are reviewed to determine which resolution devices will produce different outputs when the node inputs are evaluated. In this example, the drivers provide inputs to nodes A and C, but not B. Accordingly, the enable bits 862*a*, 862*c*, and 862*d* associated with resolution devices 830*a*, 830*c* and 830*d* that are connected to nodes A and C 820*a* and 820*c* (determined via reference lists 864) are activated, thereby enabling respective resolution devices 830*a*, 830*c*. Thus, enable bits A, C and D are activated or set to "1" in order to enable resolution devices A, C and D. In contrast, enable bit B is de-activated or maintained as de-activated or set to "0" so that resolution device B is disabled or remains disabled. As a result, only resolution devices A, C and D are selected to be evaluated using the values from their respective nodes, Node A and Node C. The evaluation of resolution device B is not performed.

Figure 10:
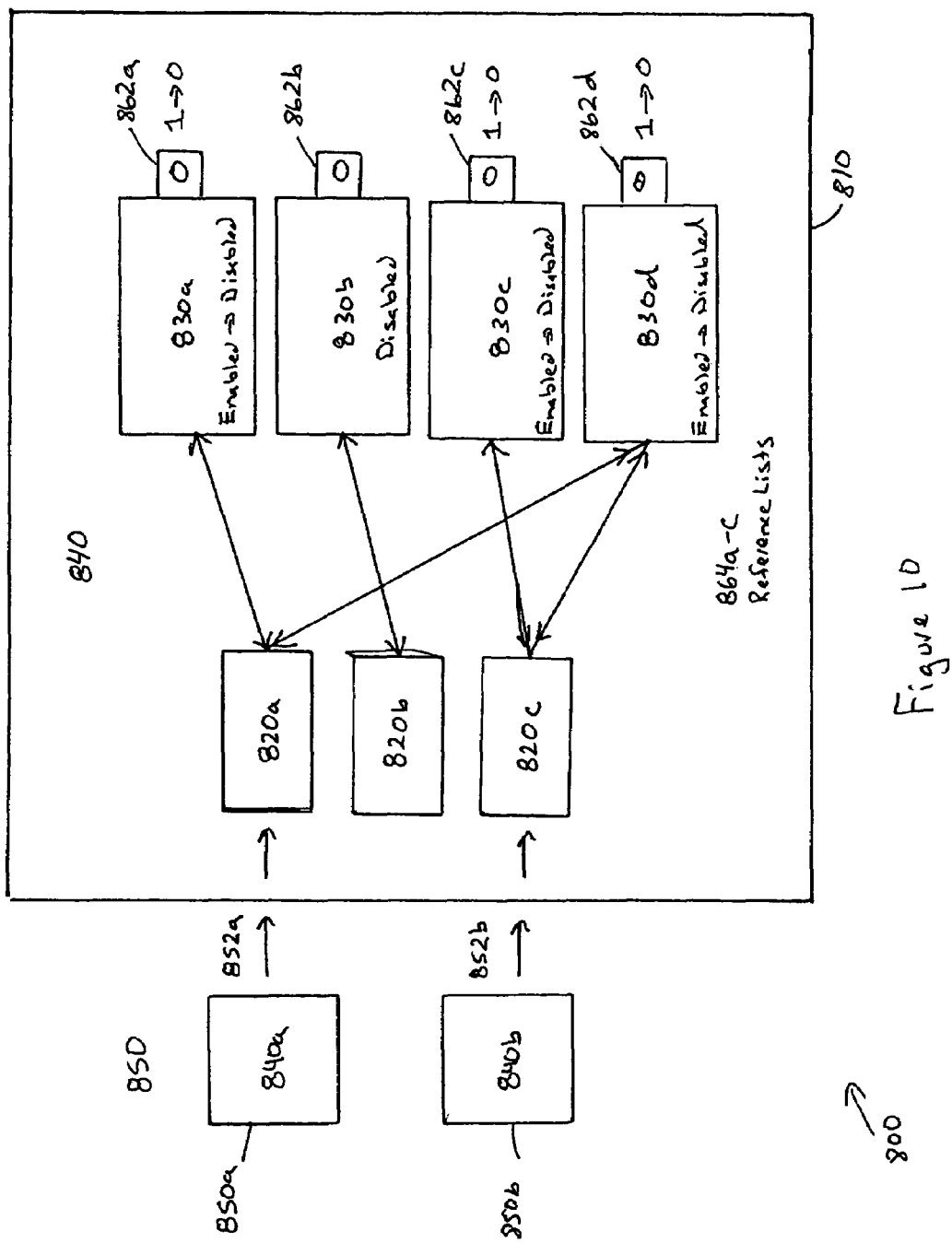
FIG. 10 illustrates de-activating an enabling element following evaluation of an enabled resolution device.

Referring to FIG. 10, as resolution devices A, C and D 830*a*, 830*c*, 830*d* are evaluated, their corresponding enable bits are de-activated or switched from "1" to "0". Consequently, the resolution devices 830*a*, 830*c*, 830*d* are reset to a disabled state, and ready for the next iteration if necessary. Persons of ordinary skill in the art will appreciate that enable bits may be de-activated at various times. In one embodiment, the enable bits are de-activated during the evaluation. In an alternative embodiment, the enable bits are de-activated after the evaluation is completed. This specification refers to de-activating enable bits while a resolution device is being evaluated for purposes of explanation, not limitation.

Figure 11:
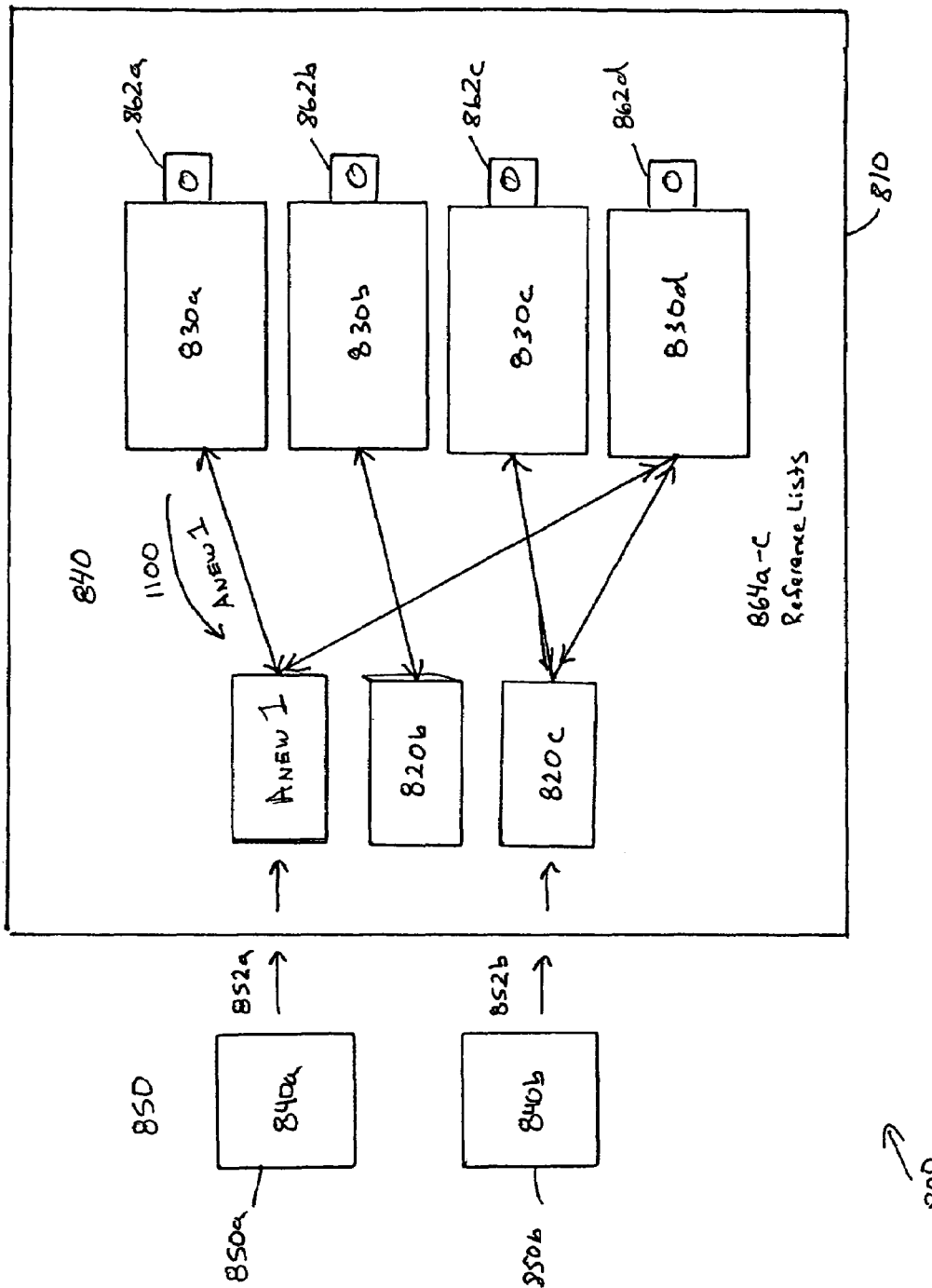
FIG. 11 illustrates enablement element settings during a subsequent iteration.
Figure 12:
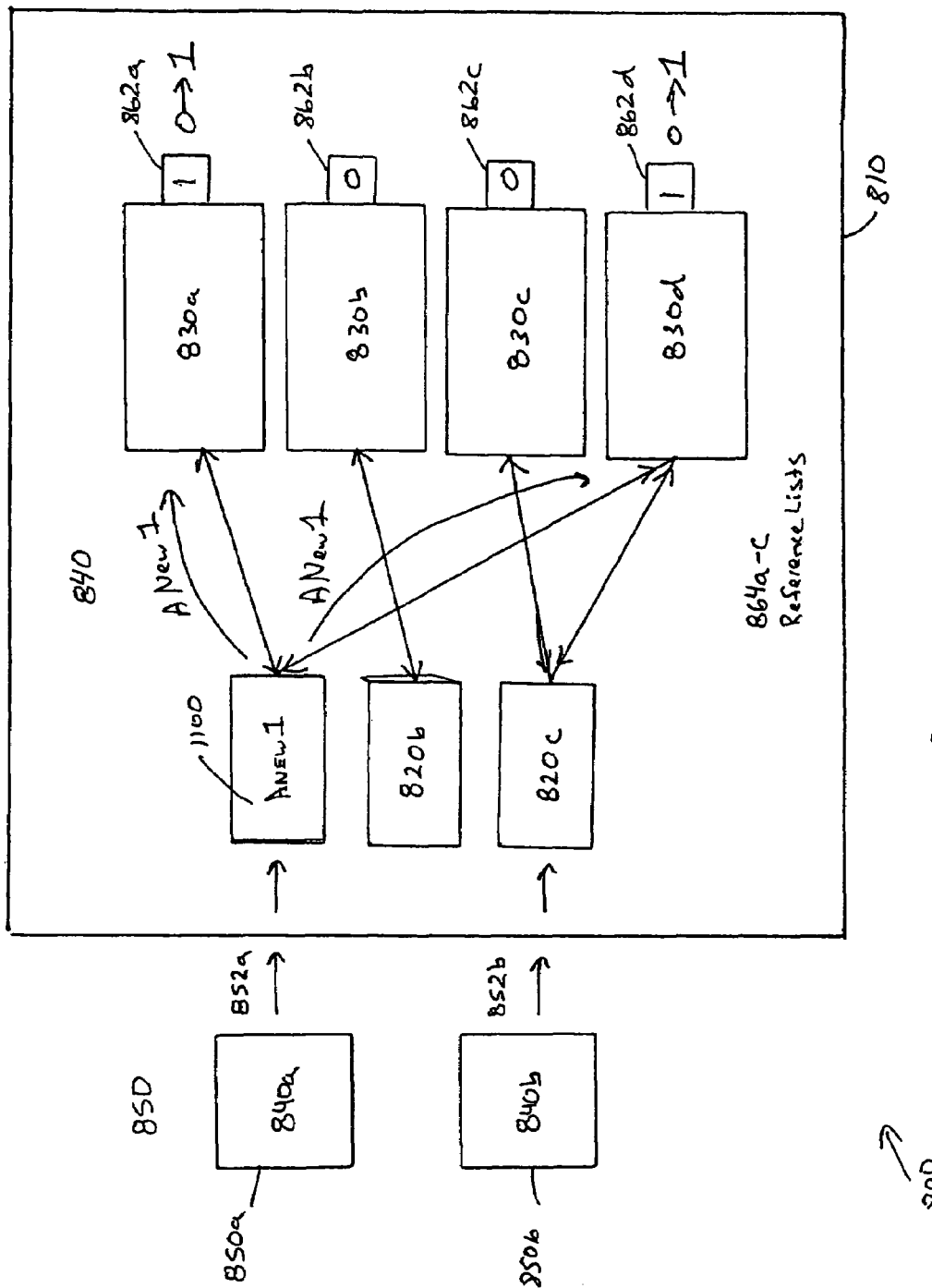
FIG. 12 illustrates node values resulting from a subsequent iteration.

FIGS. 11 and 12 illustrate an example in which an earlier iteration generates a new node value Anew1 400. Anew1 could have been generated by resolution device 830*a* or 830*d*. The node values including Anew1 1100 may resolve the network, in which case they can be output to a reader. If these values are not stable, then one or more other iterations can be performed as previously described. For example, FIG. 12 shows resolution devices 830*a* and 830*d*, (and other resolution devices connected to node 820*a* that stores the new value) can be enabled if the new value 1100 would cause the output of the resolution devices to change. The additional iterations can generate various other nodes values until a stable set of values is obtained.

Figure 13:
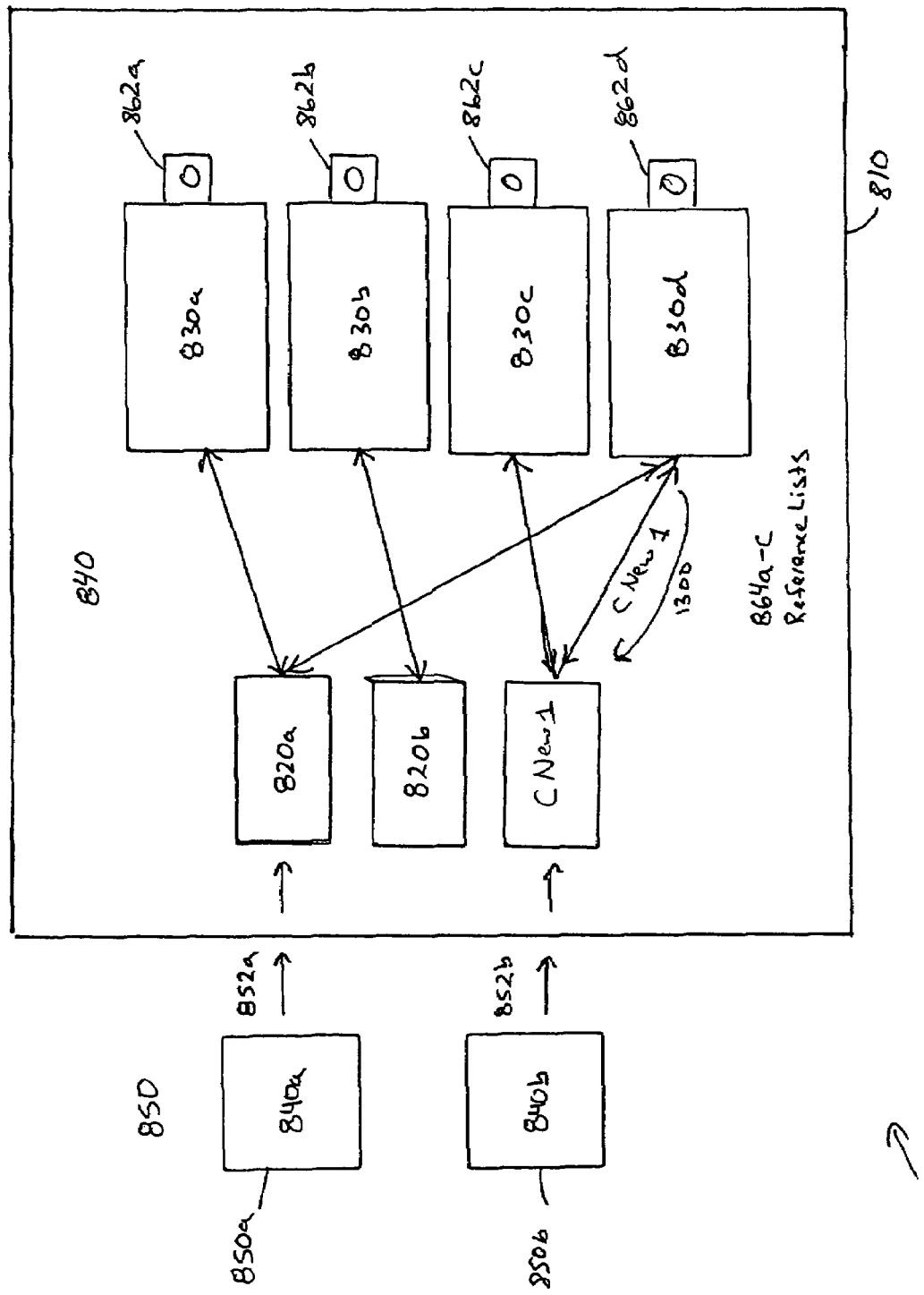
FIG. 13 illustrates enablement element settings during a subsequent iteration.
Figure 14:
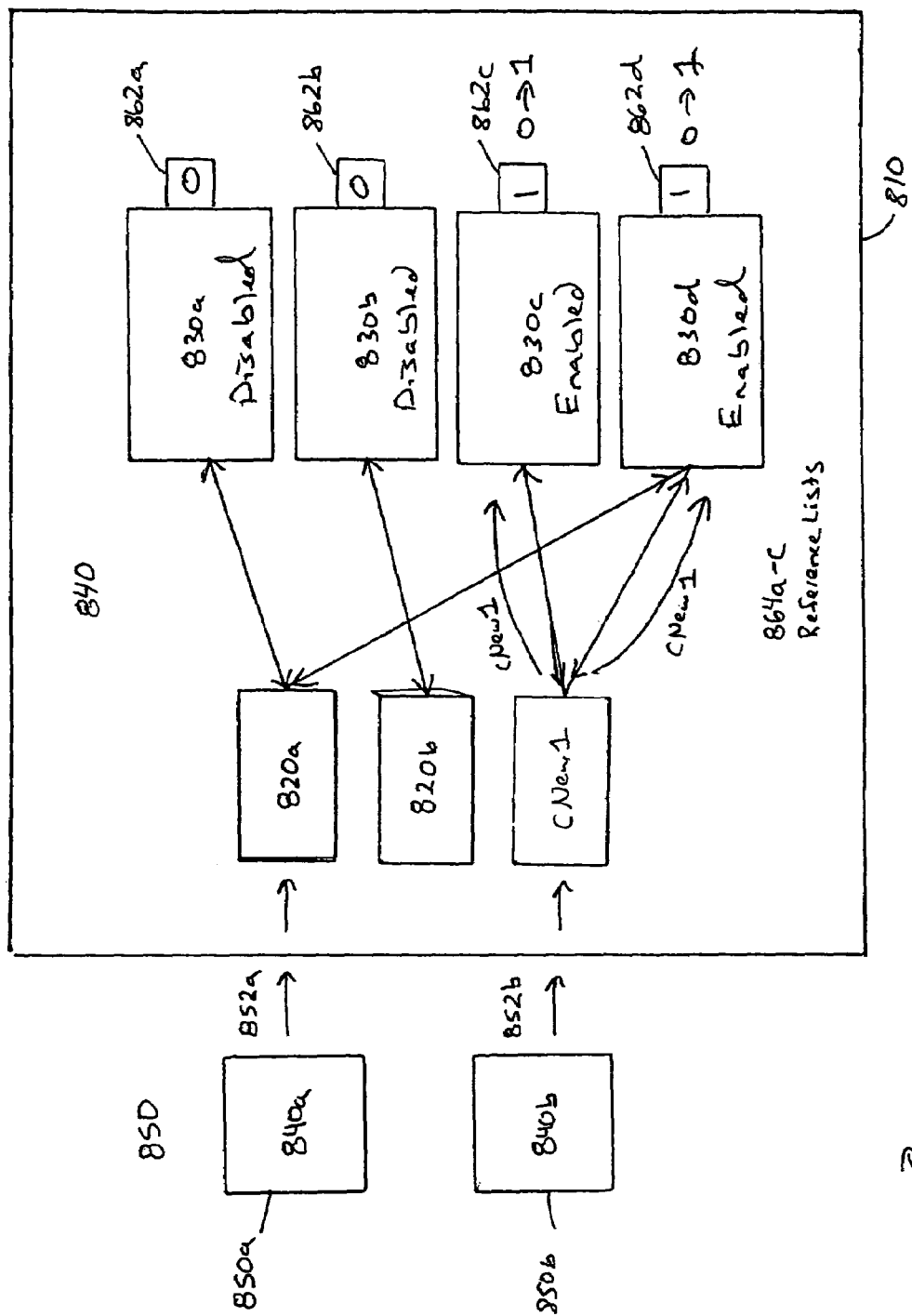
FIG. 14 illustrates other node values resulting from a subsequent iteration.

FIGS. 13 and 14 illustrate an example in which an earlier iteration generates a new node value Cnew1 1300. Cnew1 could have been generated by resolution device 830*c* or 830*d*. The node values including Cnew1 1300 may resolve the network, in which case they can be output to a reader. If these values are not stable, then one or more iterations can be performed as previously described by enabling resolution devices whose attempts may change as a result of processing the new value, Cnew1. These resolution devices may be 830*c* and 830*e*, thus, the enabling bids are activated and these resolution devices are enabled. The additional iterations can generate various other nodes values until a stable set of values is obtained.

Enhancing iterative resolution devices with PES capabilities provides a number of benefits compared to standard resolution methods. For example, adding PES capabilities to iterative resolution devices provides the ability to conditionally evaluate resolution devices which, in turn, eliminates unnecessary evaluations of certain resolution devices. Thus, resolution device evaluations are completed in a more time efficient manner. Further, by using a combination of TRAN iteration and PES principles, it is not necessary to convert the TRAN network into an equivalent set of basic device representations, which are then evaluated using a traditional event simulator, as is done in some known systems. Thus, embodiments provide an efficient method and system that provides a time and space efficient manner of resolving network and circuit values.

Although references have been made in the foregoing description to various embodiments, persons of ordinary skill in the art will recognize that insubstantial modifications, alterations, and substitutions can be made to the described embodiments without departing from the accompanying claims. For example, a combination iterative resolution and PES system may utilize various numbers of drivers, nodes and resolution devices. Thus, embodiments can be used with networks and circuits of varying complexities. Further, various numbers of iterations may be performed to resolve network values.

What is claimed:

1. A method of analyzing a circuit, comprising:
providing an evaluation system, the evaluation system including a plurality of nodes and a plurality of resolution devices, each node being associated with a resolution device, at least one node being configured to store data;
associating an enabling element with each resolution device; activating an enabling element if an output of the associated resolution device will change based on data of an associated node changing;
enabling one or more resolution devices that are associated with activated enabling elements, and
executing the one or more enabled resolution devices using the changed node data from the one or more nodes that are associated with the enabled resolution devices,
wherein executing the one or more enabled resolution devices results in generating an output that is the same as data currently stored in a node, and
wherein executing the one or more enabled resolution devices results in generating outputs that are the same as data currently stored in respective nodes to thereby provide static node data and a solution of the circuit.

2. The method of claim 1, providing the evaluation system comprising providing a plurality of iterative resolution devices.

3. The method of claim 1, providing the evaluation system comprising providing a plurality of bi-directional resolution devices, whereby data can be provided from a node to a resolution device and from a resolution device to a node.

4. The method of claim 1, providing the evaluation system comprising providing a reference list, the reference list identifying resolution devices and nodes that are associated with each other.

5. The method of claim 1, providing the evaluation system comprising providing a resolution device that is associated with a plurality of nodes.

6. The method of claim 1, providing the evaluation system comprising providing a plurality of nodes, multiple nodes receiving the same data from different drivers.

7. The method of claim 1, providing the evaluation system comprising providing a plurality of nodes, the nodes initially storing undriven data.

8. The method of claim 1, further comprising associating a subject node being evaluated with other nodes that are associated with resolution devices having outputs that change based on a change of data in the subject node.

9. The method of claim 1, associating the enabling element comprising associating an enable bit with each resolution device.

10. The method of claim 1, activating comprising activating all of the enabling elements.

11. The method of claim 1, activating comprising activating some of the enabling elements.

12. The method of claim 1, enabling resolution devices comprising enabling all of the resolution devices.

13. The method of claim 1, enabling resolution devices comprising enabling some of the resolution devices.

14. The method of claim 1, further comprising de-activating enabling elements that are associated with resolution devices that were executed with the changed node data.

15. The method of claim 1, further comprising reading the static node.

16. The method of claim 1, all of the static node data being different than respective initial node data.

17. The method of claim 15, some of the static node data being different than the initial node data.

18. The method of claim 1, further comprising disabling a resolution device as the resolution device is executed.

19. The method of claim 1, further comprising disabling a resolution device after the resolution device is executed.

20. The method of claim 1, further comprising generating new node data, the new node data being generated by a resolution device.

21. The method of claim 20, further comprising disabling the resolution device that generated the new node data.

22. The method of claim 20, further comprising
activating an enabling element if an output of the associated resolution device will change based on the new node data enabling a resolution device, a resolution device being enabled if the resolution device is associated with an activated enabling element, and
executing the enabled resolution device using the new node data.

23. The method of claim 20, the new node data being provided by a resolution device to a single node.

24. The method of claim 20, the new node data being provided by a resolution device to a plurality of nodes.

25. The method of claim 1, an enabling element being activated to enable a corresponding resolution device if the resolution device is connected to a node that initially receives input data from a driver.

26. The method of claim 1, an enabling element being activated to enable a first resolution device if the first resolution device receives, as an input, an output of a second resolution device, causing the output of the first resolution device to change.

27. A method of analyzing a circuit, comprising:
providing an evaluation system, the evaluation system including a plurality of nodes and a plurality of resolution devices, each node being associated with a resolution device, at least one node being configured to store data;
associating an enabling element with each resolution device; activating an enabling element if an output of the associated resolution device will change based on data of an associated node changing;
enabling one or more resolution devices that are associated with activated enabling elements,
executing the one or more enabled resolution devices using the changed node data from the one or more nodes that are associated with the enabled resolution devices;
generating new node data, the new node data being generated by a resolution device;
activating an enabling element if an output of the associated resolution device will change based on the new node data enabling a resolution device, a resolution device being enabled if the resolution device is associated with an activated enabling element, and
executing the enabled resolution device using the new node data,
wherein additional iterations of generating new data, activating enabling elements, enabling resolution devices, and executing enabled resolution devices are repeated until static node data is generated.

28. A method of analyzing a circuit, comprising:
providing an evaluation system, the evaluation system including a plurality of nodes and a plurality of resolution devices, each node being associated with a resolution device, at least one node being configured to store data,
associating an enabling bit with each resolution device;
activating an enabling bit if the enabling bit is associated with a resolution device having an output that will change based on data of an associated node changing;
enabling one or more resolution devices that are associated with an activated enabling elements;
executing the enabled resolution devices using the change node data from the nodes that are associated with the enabled resolution devices; and
de-activating enabling bits that are associated with resolution devices that have been executed,
wherein executing the one or more enabled resolution devices resulting in generating an output that is the same as data currently stored in an associated node, and
wherein executing the one or more enabled resolution devices resulting in generating outputs that are the same as data currently stored in respective nodes to thereby provide static node data and a solution of the circuit.

29. The method of claim 28, providing the evaluation system comprising providing a plurality of iterative resolution devices.

30. The method of claim 28, providing the evaluation system comprising providing a plurality of bi-directional resolution devices, whereby data can be provided from a node to a resolution device and from a resolution device to a node.

31. The method of claim 28, providing the evaluation system comprising providing a reference list, the reference list identifying resolution devices and nodes that are associated with each other.

32. The method of claim 28, providing the evaluation system comprising providing a resolution device that is associated with a plurality of nodes.

33. The method of claim 28, providing the evaluation system comprising providing a plurality of nodes, multiple nodes receiving the same data from different drivers.

34. The method of claim 28, providing the evaluation system comprising providing a plurality of nodes, the nodes initially storing undriven data.

35. The method of claim 28, further comprising associating a subject node being evaluated with other nodes that are associated with resolution devices having outputs that change based on a change of data in the subject node.

36. The method of claim 28, activating comprising activating all of the enabling bits.

37. The method of claim 28, activating comprising activating some of the enabling bits.

38. The method of claim 28, enabling resolution devices comprising enabling all of the resolution devices.

39. The method of claim 28, enabling resolution devices comprising enabling some of the resolution devices.

40. The method of claim 28, further comprising reading the static node data.

41. The method of claim 28, all of the static node data being different than respective initial node data.

42. The method of claim 28, some of the static node data being different than the initial node data.

43. The method of claim 28, further comprising de-activating a previously activated enabling bit that is associated with a resolution device that was executed, thereby disabling the resolution device.

44. The method of claim 28, further comprising generating new node data, the new node data being generated by a resolution device.

45. The method of claim 44, further comprising de-activating a previously activated enabling bit that is associated with a resolution device that generated the new node data, thereby disabling the resolution device.

46. The method of claim 44, further comprising
activating an enabling bit that is associated with a resolution device that is associated with a node that receive new data;
enabling a resolution device, a resolution device being enabled if the resolution device is associated with an activated enabling bit;
executing the enabled resolution device using the new node data.

47. The method of claim 46, wherein additional iterations of generating new node data, activating enabling bits, enabling selected resolution devices, and executing the enabled resolution devices are repeated until static node data is generated.

48. The method of claim 46, the new node data being provided by a resolution device to a single node.

49. The method of claim 46, the new node data being provided by a resolution device to a plurality of nodes.

50. The method of claim 28, an enabling element being activated to enable a corresponding resolution device if the resolution device is connected to a node that initially receives input data from a driver.

51. The method of claim 28, an enabling element being activated to enable a first resolution device if the first resolution device receives, as an input, an output of a second resolution device, causing the output of the first resolution device to change.

52. A system for analyzing a circuit, comprising:
a circuit evaluation system, the circuit evaluation system including:
a plurality of nodes, and
a plurality of iterative resolution devices,
each node being associated with an iterative resolution device, and at least one node being configured to receive data from an input, and at least one node being configured to store data,
a plurality of enabling elements, each iterative resolution device being associated with an enabling element,
wherein the enabling bits are activated if the enabling bits are associated with iterative resolution devices having an output that will change based on data of an associated node changing, the selected resolution devices are enabled in response to the activated enabling bits, and the selected resolution devices are executed using data in nodes that are associated with the enabled resolution devices,
wherein executing the selected resolution devices results in generating an output that is the same as data currently stored in a node, and
wherein executing the selected resolution devices results in generating outputs that are the same as data currently stored in respective nodes to thereby provide static node data and a solution of the circuit.

53. The system of claim 52, the circuit evaluation system comprising a plurality of bi-directional iterative resolution devices, wherein data can be provided from a node to an iterative resolution device and from an iterative resolution device to a node.

54. The system of claim 52, the circuit evaluation system comprising a reference list, the reference list identifying iterative resolution devices and nodes that are associated with each other.

55. The system of claim 52, the circuit evaluation system comprising an iterative resolution device that is associated with a plurality of nodes.

56. The system of claim 52, an iterative resolution device being executed to generate an output that is the same as the current node data.

57. The system of claim 52, an iterative resolution device being executed to generate static node data and a solution for the circuit.

58. The system of claim 52, an iterative resolution device being disabled while the iterative resolution device is executed.

59. The system of claim 52, an iterative resolution device being disabled after the iterative resolution device is executed.

60. The method of claim 52, a current node that is being evaluated being associated with other nodes whose values may change after the current node is evaluated.

* * * * *